United States Patent [19]

Murray et al.

[11] Patent Number: 5,365,130
[45] Date of Patent: Nov. 15, 1994

[54] SELF-COMPENSATING OUTPUT PAD FOR AN INTEGRATED CIRCUIT AND METHOD THEREFOR

[75] Inventors: Joseph Murray, Scottsdale; Ned D. Garinger, Tempe; Peter H. Sorrells, Chandler, all of Ariz.

[73] Assignee: VLSI Technology, Inc., San Jose, Calif.

[21] Appl. No.: 926,979

[22] Filed: Aug. 7, 1992

[51] Int. Cl.$^5$ .......................... H03K 5/13; H03K 5/26
[52] U.S. Cl. ..................................... 327/278; 327/237
[58] Field of Search ............... 307/264, 358, 493, 591, 307/597, 601, 603, 606, 262, 511; 328/55, 56, 72, 77, 139, 155, 201

[56] References Cited

U.S. PATENT DOCUMENTS 4,795,985 1/1989 Gailbreath .......................... 328/155

Primary Examiner—Timothy P. Callahan
Assistant Examiner—Shawn Riley
Attorney, Agent, or Firm—Harry M. Weiss

[57] ABSTRACT

An output pad for an integrated circuit includes circuitry to align the output with an on-chip clock signal, and to compensate the output such that it remains coincident with the on-chip clock signal even when changes occur in power supply voltage, manufacturing process and temperature. This output pad has a closed-loop feedback circuit which controls the delay of the output signal through a variable delay element. The loop adjust the delay until the clock edge of the on-chip clock signal is coincident with the output signal within a defined tolerance. The output pad self-compensates with every clock cycle, which is many times faster than any induced variation.

9 Claims, 1 Drawing Sheet

SELF-COMPENSATING OUTPUT PAD FOR AN INTEGRATED CIRCUIT AND METHOD THEREFOR

RELATED APPLICATION

This patent application is related to another U.S. patent application entitled "Delay-Compensated Output Pad for an Integrated Circuit and Method Therefor" by inventor Sorrells and Garinger which is assigned to the same assignee as this patent application.

FIELD OF THE INVENTION

This invention generally relates to integrated circuits and methods, and, more specifically, relates to an output pad for an integrated circuit and method therefor having an internal clock signal, which has circuitry to delay an output signal until the following clock edge occurs, thereby synchronizing the output signal to the clock. This synchronized output reduces skew thereby allowing the system to operate at a higher speed than would otherwise be possible.

DESCRIPTION OF THE PRIOR ART

Certain high-speed circuits such as high-speed computer systems require the generation of particular electronic signals exactly coincident with clock edges. In slower systems where there is ample time to decode input signals and generate the proper response, this problem is not an issue. But in modern high-speed systems, especially computers using high-speed cache subsystems, clock-edge timing is critical. There is no known prior art that provides compensation and alignment of output signals to clock signals at the output pad of an integrated circuit.

Therefore, there existed a need to provide a self-compensating output pad and method which aligns the output signal to the next following clock edge, and which does not vary over variations in power supply voltage, manufacturing process or temperature. This self-compensating synchronization allows designing cache or memory controllers or other digital systems that operate at a higher speed than was previously possible.

SUMMARY OF THE INVENTION

It is an object of this invention to provide an output pad for an integrated circuit and method therefor which aligns the output signal with the following clock edge.

It is another object of this invention to provide a self-compensating output pad for an integrated circuit and method therefor which aligns the output signal with the following clock edge and which self-compensates at each clock cycle, eliminating variations between the output and the clock caused by power supply fluctuation, process variation and temperature changes.

According to the present invention, an output pad for an integrated circuit is provided. This pad has circuitry that has two inputs, namely, an On-chip Logic signal and a Clock signal. The On-chip Logic signal is the logic output that would normally be connected directly to the output pad in conventional, integrated circuits. The Clock signal is the signal to which the output is to be time aligned. The Clock signal is the signal the On-chip Logic signal with the negative edge of the clock. This latched output is the input to a Variable Delay Element, which delays the latched output. An Edge Detection and Delay Control block compares the output of the Variable Delay Element to the positive edge of the clock, and changes the delay of the Variable Delay Element until its output is coincident with the positive clock edge within a predetermined tolerance. In this manner the output signal is delayed and time aligned to the positive edge of the Clock signal. This loop takes several cycles to stabilize when the integrated circuit is initially powered up, but once the loop stabilizes it will automatically adjust the Variable Delay Element each cycle as needed to compensate for variations caused by changes in power supply voltage, manufacturing process and temperature.

The foregoing and other objects, features and advantages will be apparent from the following description of the preferred embodiment of the invention as illustrated in the accompanying drawings.

DESCRIPTION OF THE PREFERRED EMBODIMENT

Figure 1:
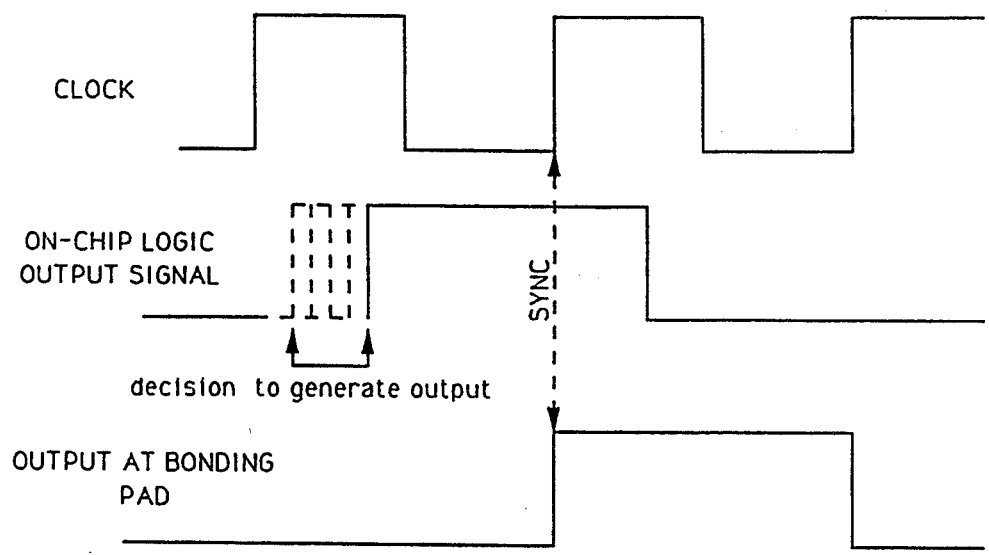
FIG. 1 is a timing diagram showing the function of the output pad of the present invention.

Referring to the figures, FIG. 1 shows the timing waveforms which correspond to the output pad of the present invention. In a conventional integrated circuit, the On-chip Logic Output Signal is coupled directly to the Bonding Pad, making the timing relationship between the Clock signal and the On-chip Logic Output signal uncertain, and subject to variations caused by changes in power supply voltage, manufacturing process or temperature. However, with the output pad of the present invention, the Output at Bonding Pad is output coincident with the rising edge of the clock as shown, and as described below with reference to FIG. 2.

Figure 2:
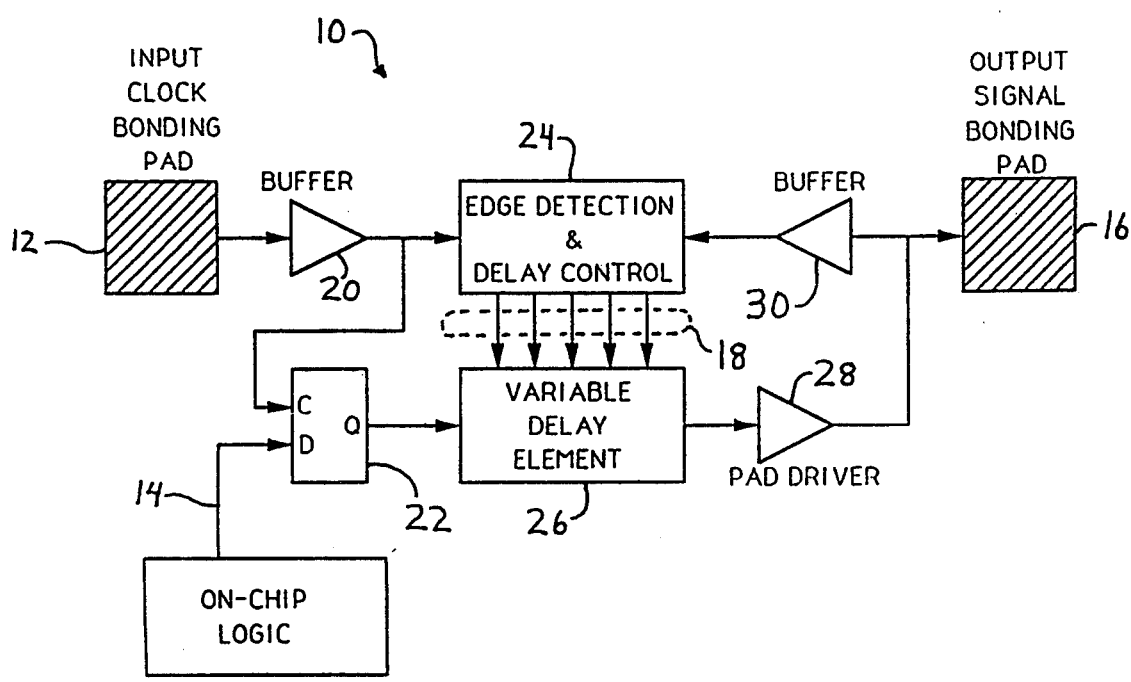
FIG. 2 is a block diagram schematic of the output pad of the present invention.

FIG. 2 shows the configuration of the output pad 10 of the present invention, which includes an Input Clock Bonding Pad 12, an On-chip Logic Output Signal 14, and an Output Signal Bonding Pad 16. The On-chip Logic Output Signal 14 represents any subsystem on-chip, such as a cache controller, which determines during a particular clock cycle that an output signal must be driven coincident with the next clock edge. The input of Buffer 20 is connected to Input Clock Bonding Pad 12 as shown. The output of Buffer 20 is connected to the clock input of a singlebit D Flip Flop 22 as shown, and to the input of Edge Detection and Delay Control block 24. The delay from input to output on Variable Control Element 26 is controlled by a control word 18 from Edge Detection and Delay Control block 24. The output of Variable Delay Element 26 is connected to the input of Pad Driver 28, the output of which drives Output Signal Bonding Pad 16 and the input to Buffer 30.

D Flip Flop 22 is negative edge-triggered, passing the logic level on the D input (from the On-chip Logic Output Signal 14) to the Q output when the output of Buffer 20 (the Clock Signal input) makes a high-to-low transition. The Q output of D Flip Flop 22 is delayed by Variable Delay Element 26, then passed through Pad Driver 28 and Buffer 30. The Edge Detection and Delay Control block 24 compares the rising edge of the output of Buffer 20 with the rising edge of the output of Buffer 30, and adjusts the control word 18 which determines the length of delay in the Variable Delay Element 26 accordingly. For example, if the output of Buffer 20 arrives first, the control word to the Variable Delay Element 26 is configured to reduce the delay. If the output of Buffer 30 arrives first, the control word to the Variable Delay Element 26 is configured to increase the delay. This adjustment continues cycle-by-cycle in this manner until the output of Buffer 20 arrives coincident with the output of Buffer 30 within some pre-defined tolerance. Note that Buffer 20 and Buffer 30 are identical to assure identical delays, which assures that once the two edges are coincident at the Edge Detection and Delay Control block 24, they are also coincident at the bonding pads 12 and 16. At this point the loop has stabilized, and will dynamically change the delay across the Variable Delay Element 26 as needed with each clock cycle, thereby compensating for variations that occur as a result of changes in power supply voltage, manufacturing process or temperature. These induced variations occur much more slowly than the adjustment speed of the output pad 10, since output pad 10 self-compensates with each clock cycle. The Variable Delay Element 24 is therefore used to take up the slack time between the on-chip logic decision point shown in FIG. 1 and the next positive clock edge, to insure that the signal is driven externally only when it is coincident with this clock edge.

While the invention has been described in its preferred embodiment, it is to be understood that the words which have been used are words of description rather than limitation, and that changes may be made within the purview of the appended claims without departing from the true scope and spirit of the invention in its broader aspects. For example, the specific clock edges detected by the Edge Detection and Delay Control block 24 and used to clock the D Flip Flop 22 could be changed without departing from the scope of the present invention.

What is claimed is:

1. An output pad for an integrated circuit comprising, in combination:

circuitry means for driving an output of said integrated circuit to a conductor external to said integrated circuit;

first input means for providing a logic output from said integrated circuit to said circuitry means, said circuitry means delaying said logic output thereby providing a delayed output signal;

second input means coupled to said circuitry means for providing a clock signal from said integrated circuit to said circuitry means, said circuitry means delaying said logic output until an edge of said delayed output signal is coincident with an edge of said clock signal; and output means coupled to said circuitry means for coupling said delayed output signal to said conductor;

said circuitry means comprising, in combination:

edge detector and delay control means coupled to said second input means and to said delayed output signal for detecting said edge of said clock signal and said edge of said delayed output signal to determine which of said edges occurs first, and having control word output means for providing an output that changes depending on which of said edges occurs first;

latch means coupled to said logic output for providing a clocked output signal which is synchronized to an edge of said clock signal; and variable delay means coupled to said clocked output signal of said latch means having control word input means coupled to said control word output means for providing a delay from said logic output to said delayed output signal, said delay being determined by the value of said control word input means, said control word output means increasing said delay when said edge of said delayed output signal occurs before said edge of said clock signal, said control word output means decreasing said delay when said clock signal occurs before said delayed output signal, and said control word output means maintaining the same delay when said clock signal occurs coincident with said delayed output signal within a predetermined tolerance;

said output pad further comprising an input buffer having its input coupled to said second input means and having its output coupled to said latch means, and an output buffer having its input coupled to said delayed output signal and to said output means and having its output coupled to said edge detector and delay control means, said input buffer and said output buffer having identical propagation delay times.

2. The output pad of claim 1 wherein said second input means comprising bonding pad means for connecting said clock signal to said circuitry means.

3. The output pad of claim 1 wherein said output means comprising bonding pad means for connecting said delayed output signal to said conductor.

4. A method for synchronizing and compensating an integrated circuit output at an output pad for assuring said output only occurs coincident with a clock edge comprising the steps of:

providing circuitry means for driving said output to said output pad;

providing first input means for providing a logic output from said integrated circuit to said circuitry means, said circuitry means delaying said logic output thereby providing a delayed output signal;

providing a clock signal from said integrated circuit to said circuitry means;

delaying said logic output with said circuitry means until an edge of said delayed output signal is coincident with an edge of said clock signal; and providing output means coupled to said circuitry means for coupling said delayed output signal to an external conductor;

said circuitry means comprising, in combination:

edge detector and delay control means coupled to said second input means and to said delayed output signal for detecting said edge of said clock signal and said edge of said delayed output signal to determine which of said edges occurs first, and having control word output means for providing an output that changes depending on which of said edges occurs first;

latch means coupled to said logic output for providing a clocked output signal which is synchronized to an edge of said clock signal; and variable delay means coupled to said clocked output signal of said latch means having control word input means coupled to said control word output means for providing a delay from said logic output to said delayed output signal, said delay being determined by the value of said control word input means, said control word output means increasing said delay when said edge of said delayed output signal occurs before said edge of said clock signal, said control word output means decreasing said delay when said clock signal occurs before said delayed output signal, and said control word output means maintaining the same delay when said clock signal occurs coincident with said delayed output signal within a predetermined tolerance;

said output pad further comprising an input buffer having its input coupled to said second input means and having its output coupled to said latch means, and an output buffer having its input coupled to said delayed output signal and to said output means and having its output coupled to said edge detector and delay control means, said input buffer and said output buffer having identical propagation delay times.

5. An output pad for an integrated circuit comprising, in combination:

circuitry means having a variable delay element for driving an output of said integrated circuit to a conductor external to said integrated circuit and for delaying a logic output by a variable amount of time defined by a variable control word thereby providing a delayed output signal;

first input means for providing said logic output from said integrated circuit to said variable delay element of said circuitry means;

second input means coupled to said circuitry means for providing a clock signal from said integrated circuit to said circuitry means, said variable delay element of said circuitry means delaying said logic output by said variable amount of time until an edge of said delayed output signal is coincident with an edge of said clock signal; and output means coupled to said circuitry means for coupling said delayed output signal to said conductor.

6. The output pad of claim 5 wherein said second input means comprising bonding pad means for connecting said clock signal to said circuitry means.

7. The output pad of claim 5 wherein said output means comprising bonding pad means for connecting said delayed output signal to said conductor.

8. An output pad for an integrated circuit comprising, in combination:

circuitry means having a variable delay element for driving an output of said integrated circuit to a conductor external to said integrated circuit;

first input means for providing a logic output from said integrated circuit to said variable delay element of said circuitry means, said variable delay element of said circuitry means delaying said logic output by a variable amount of time thereby providing a delayed output signal;

second input means coupled to said circuitry means for providing a clock signal from said integrated circuit to said circuitry means, said variable delay element of said circuitry means delaying said logic output by said variable amount of time until an edge of said delayed output signal is coincident with an edge of said clock signal; and output means coupled to said circuitry means for coupling said delayed output signal to said conductor;

said circuitry means comprising, in combination:

edge detector and delay control means coupled to said second input means and to said delayed output signal for detecting said edge of said clock signal and said edge of said delayed output signal to determine which of said edges occurs first, and having control word output means for providing an output that changes depending on which of said edges occurs first;

latch means coupled to said logic output for providing a clocked output signal which is synchronized to an edge of said clock signal; and said variable delay element comprising variable delay means coupled to said clocked output signal of said latch means having control word input means coupled to said control word output means for providing a delay from said logic output to said delayed output signal, said delay being determined by the value of said control word input means, said control word output means increasing said delay when said edge of said delayed output signal occurs before said edge of said clock signal, said control word output means decreasing said delay when said clock signal occurs before said delayed output signal, and said control word output means maintaining the same delay when said clock signal occurs coincident with said delayed output signal within a predetermined tolerance.

9. The output pad of claim 8 further comprising an input buffer having its input coupled to said second input means and having its output coupled to said latch means, and an output buffer having its input coupled to said delayed output signal and to said output means and having its output coupled to said edge detector and delay control means, said input buffer and said output buffer having identical propagation delay times.

* * * * *